United States Patent [19]
Fiorina et al.

[11] Patent Number: 5,574,362
[45] Date of Patent: Nov. 12, 1996

[54] ELECTRICAL ENERGY MEASURING AND METERING DEVICE

[75] Inventors: Jean-Noël Fiorina, Seyssinet-Pariset; Jean-Jacques Pillet, St. Egreve, both of France

[73] Assignee: Schneider Electric SA, France

[21] Appl. No.: 252,359

[22] Filed: Jun. 1, 1994

[30] Foreign Application Priority Data

Jun. 11, 1993 [FR] France .................................. 93 07161

[51] Int. Cl.$^6$ ........................................................ G01R 11/00
[52] U.S. Cl. ............................................ 324/142; 324/107
[58] Field of Search ............................... 324/103 R, 116, 324/141, 142, 107; 364/481, 483, 492

[56] References Cited

U.S. PATENT DOCUMENTS

| | | | |
|---|---|---|---|
| 4,896,105 | 1/1990 | Engel et al. | 324/142 |
| 4,902,965 | 2/1990 | Bodrug et al. | 324/142 |
| 4,999,575 | 3/1991 | Germer | 324/142 |

FOREIGN PATENT DOCUMENTS 0550348  7/1993  European Pat. Off. .

OTHER PUBLICATIONS

Patent Abstracts of Japan, vol. 15, No. 433 (P–1271) Nov. 5, 1991, p. 1/1.

*Primary Examiner*—Vinh P. Nguyen
*Attorney, Agent, or Firm*—Parkhurst, Wendel & Burr, L.L.P.

[57] ABSTRACT

A metering device includes a standard AC energy meter, and a conversion circuit. The conversion circuit measures the voltages and currents of an installation incompatible with the functional characteristics of the meter. The conversion circuit supplies the meter with AC voltages and currents of values in compliance with the specifications of the meter. The total power supplied to the meter is proportional, except for a known scale factor, to the total power measured on the power system. This device is applied to measuring electrical energy on DC power systems and on AC power systems of a frequency or form incompatible with standard electrical energy meters.

10 Claims, 6 Drawing Sheets

5,574,362

1

ELECTRICAL ENERGY MEASURING AND METERING DEVICE

BACKGROUND OF THE INVENTION

The invention relates to a device for measuring and metering the electrical energy consumed by an installation, a device comprising means for measuring the currents consumed by the installation, means for measuring the associated voltages applied to the installation, and a standard electrical energy meter operating in AC and comprising current and voltage inputs.

Standard electrical energy meters operate in AC, typically at 50 or 60 Hz. They cannot be used directly for metering the electrical energy consumed by an installation supplied with DC or with AC of a frequency, for example 400 Hz, different from that for which the standard AC meter is designed.

In certain electrical energy distribution systems, it has been proposed (EP-A-550348) to supply the users from a DC energy distribution bus, the DC being obtained from the AC energy system by means of a central AC/DC conversion module. Naturally, energy metering can be performed upstream from the central module by means of a standard AC meter. However, when the installations supplied by the bus are independent and correspond to different users, it is preferable to have electrical energy metering devices associated with each of the installations. These devices must operate in DC and be homologated and qualified by electrical energy distributors and by qualification authorities to be able to be used for rating and billing the energy consumed.

Although fully electronic devices for metering electrical energy exist enabling a energy measurement to be made, either in DC or in AC, these devices are not at present homologated or have to follow a very long qualification cycle, so that they cannot be used in the short term for billing the energy consumed.

SUMMARY OF THE INVENTION

The object of the invention is to achieve an electrical energy metering device, using a standard AC meter and enabling metering of the energy consumed by an installation supplied in DC or in AC of a frequency different from that for which the standard AC meter is designed. A device of this kind will be able to be used for billing purposes without requiring a new homologation.

According to the invention, this object is achieved by the fact that the device comprises means for conversion connected between the means for measuring and the standard meter, and comprising means for producing output AC current and voltage signals suitable for the standard meter, the power corresponding to the AC current and voltage signals supplied by the converter being proportional to the electrical power of the currents and voltages supplied by the means for measuring.

According to a development of the invention, the means for measuring supply first couples of voltage and current signals, the means for conversion supplying the meter with second couples of AC voltage and current signals such that the power corresponding to the sum of the voltage-current products of the second couples of signals is proportional to the power corresponding to the sum of the voltage-current products of the first couples of signals.

The means for conversion comprises means for monitoring and modulating the amplitude of the output AC signals from the means for conversion in terms of the values of the output signals from the means for measuring, or in terms of the power associated with at least one current signal and one associated voltage signal supplied by the means for measuring.

According to a preferred embodiment, the means for conversion comprises means for amplifying the AC signals representative of the output voltages supplying output voltages of an amplitude compatible with the levels of the meter and means for voltage-current conversion converting the AC signals representative of the output currents into currents compatible with the characteristics of the meter.

BRIEF DESCRIPTION OF THE DRAWINGS

Other advantages and features will become more clearly apparent from the following description of illustrative embodiments of the invention, given as non-restrictive examples only and represented in the accompanying drawing in which.

DETAILED DESCRIPTION OF THE PREFERRED EMBODIMENT

Figure 1:
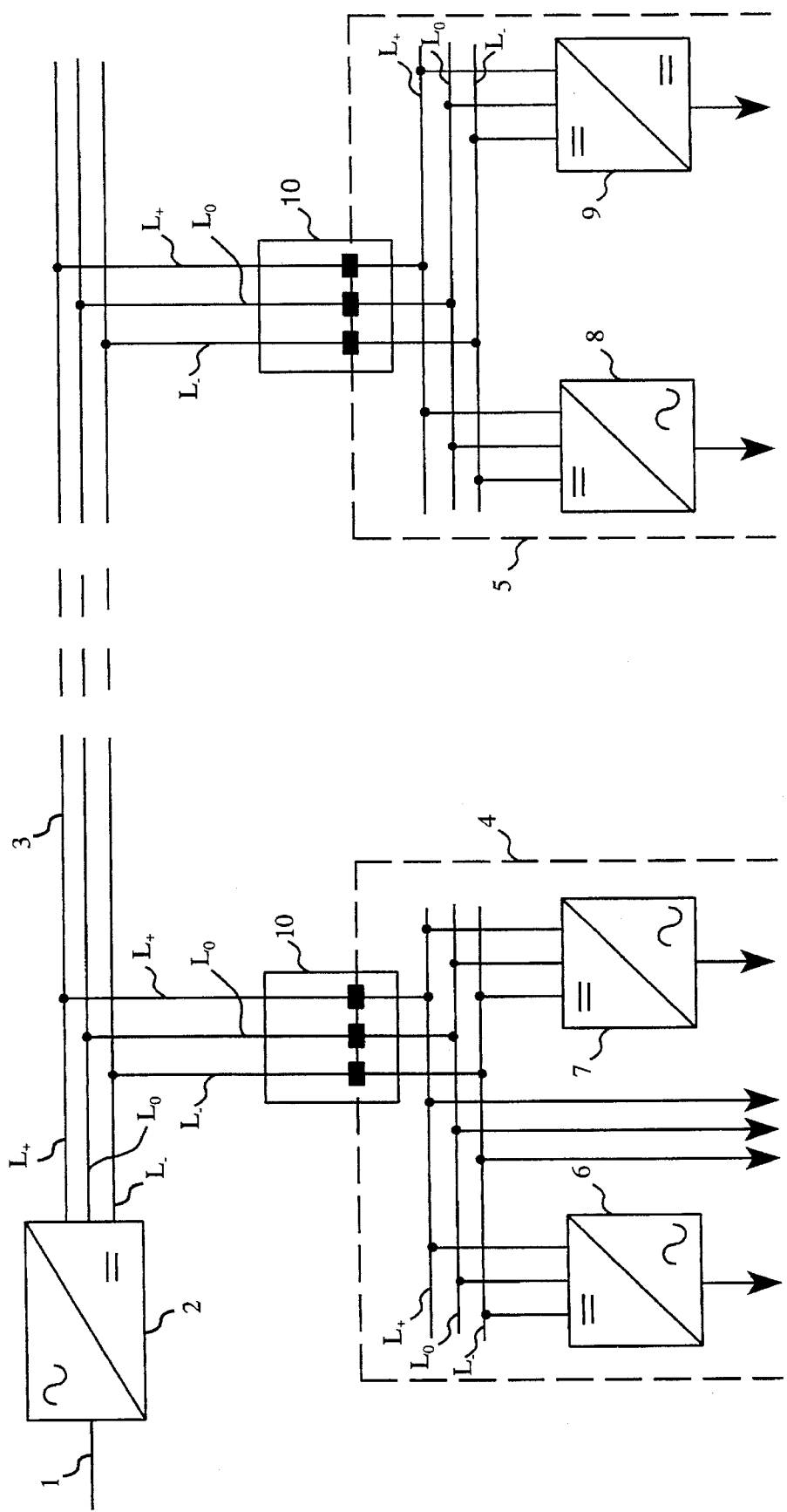
FIG. 1 represents a DC distribution system comprising energy metering devices according to the invention.

In FIG. 1 an AC power supply line 1 (50 or 60 Hz) is connected to the input of an AC/DC current converter 2. The DC current present at the converter output is supplied to a distribution system or bus 3 which supplied installations 4 and 5 with DC. In the embodiment represented, the distribution system 3 comprises a first conductor L+ in which a current I+ flows, a second conductor L− in which a current I− flows, and a common conductor LO. Each installation, 4 or 5, comprises DC/AC converters 6, 7, 8 or DC/DC converters 9 for supply of equipment which has to be supplied with AC or with DC.

In FIG. 1 a metering device 10 according to the invention is connected to the input of each of the installations 4 and 5 connected to the bus 3, to enable the energy consumed by each of these installations to be metered separately.

Figure 2:
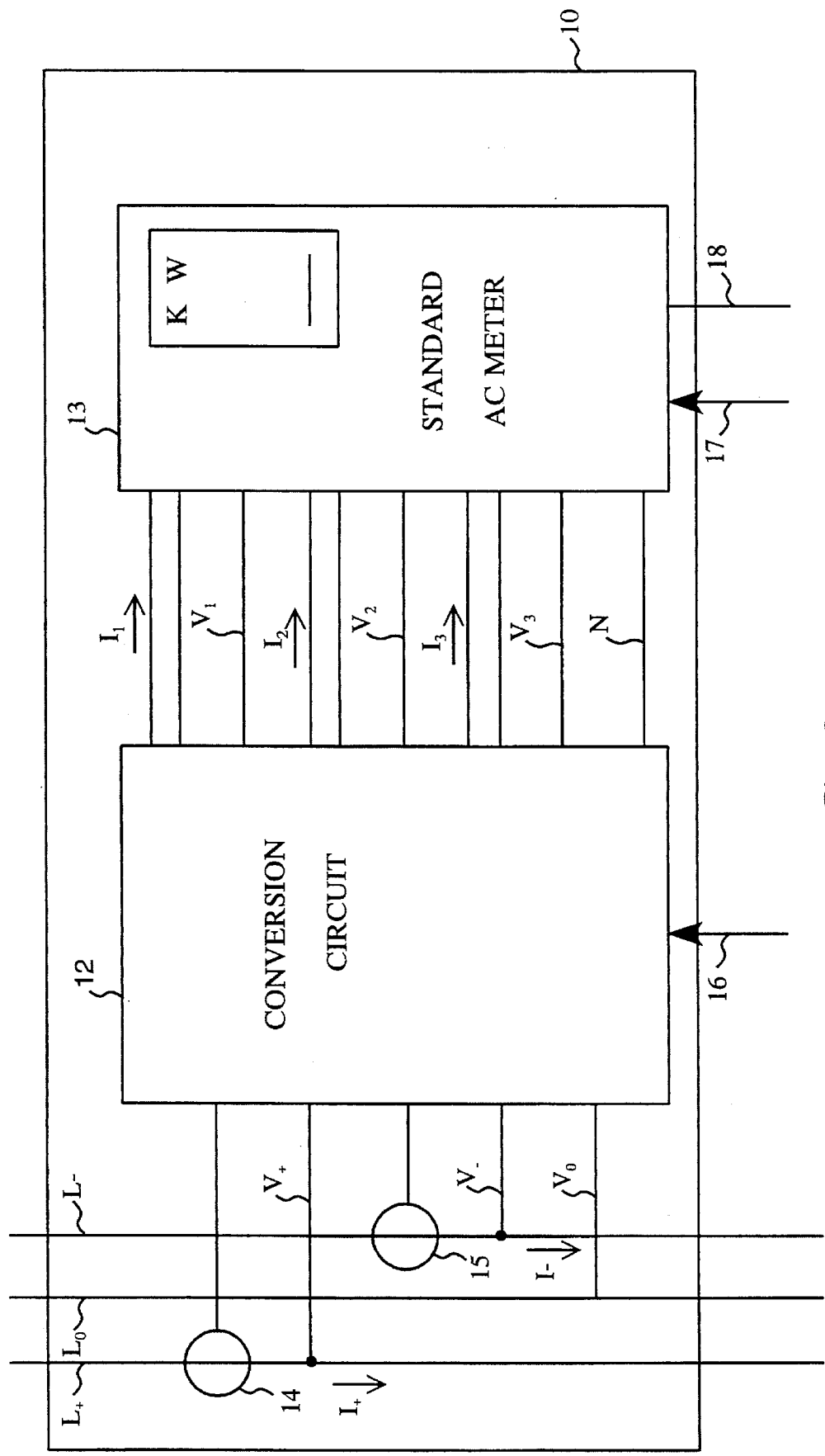
FIG. 2 represents, in block diagram form, a metering device according to the invention, able to be used with a DC distribution system according to FIG. 1.

FIG. 2 represents an embodiment of a metering device 10 designed to be used in the DC system of FIG. 1. The metering device 10 comprises a conversion circuit 12 and a standard AC electrical energy meter 13 of known type.

In the embodiment represented in FIG. 2, the meter 13 is standard three-phrase AC meter. It comprises inputs designed to receive signals (V1, V2, V3, I1, I2, I3) representative of the voltages and currents of the three phases of an AC power system. In the figure, three current inputs are each formed by two conductors normally designed to be connected to the output of current sensors located respectively on the three phases of an AC power system. The voltage inputs are formed by four conductors normally designed to be connected to each of the phase conductors and to the neutral conductor N of an AC power system. The energy W1 supplied to the meter 13 is obtained from the signals V1, V2 and V3 representative of the voltages and I1, I2, I3 representative of the currents according to the expression (1)

$$W1 = \int_0^T [(V1.I1) + (V2.I2) + (V3.V2)] dt \qquad (1)$$

The conversion circuit 12 acts as an interface between the meter 13 and a branch of the power system 3 connected to the input of the installation 4 or 5 whose energy consumption is to be measured.

The conversion circuit 12 receives signals respectively representative of the currents I+ and I– flowing in the conductors L+ and L– and signals representative of the voltages V+ and V– measured respectively between the conductors L+, L– and the common conductor LO. The current signals I+ and I– are supplied by current sensors respectively 14 and 15. The voltage signals are obtained directly by connection of the voltage inputs to the conductors L+, L–, LO. The common conductor LO supplies a reference input signal VO.

The converter 12 transforms the input signals I+, I–, V+ and V– into output current and voltages usable by the standard AC meter 13.

The energy W2 consumed to be measured can be expressed in the form:

$$W2 = \int_0^T [(V+.I+) + (V-.I-)] dt \qquad (2)$$

If the converter 12 makes the amplitudes of the DC signals correspond to the values of the AC signals by making U1 correspond to U+, U2 to U–, I1 to I+ and I2 to I– by forcing I3 to zero, it is apparent from the expressions (1) and (2) above that W1=W2. In this case, the standard three-phase meter 13 receives directly the values of the energy to be measured.

However, such a conversion is not always possible directly. In standard meters, the input voltages in fact have to be comprised between a minimum value and a maximum value which do not necessarily correspond to the voltage range of the DC power system. As far as the current is concerned, for high-intensity installations the AC current is not directly applied to the standard meter. A value representative of the current to be measured is supplied by a current transformer. Generally the meters are designed to receive maximum values of about 5 A. The transformation ratio of the current transformer then has to conform with the calibration of the meter for the measured energy value to be exact.

Consequently, to adapt to the voltage and current ranges acceptable by the standard meter 13, the converter 12 performs conversion of the signals V+, V–, I+ and I– into signals V1 to V3 and I1 to I3 so that the total output power of the converter 12 is proportional, except for a known scale factor K, to the total power P supplied to the installation associated with the metering device. The power P can be expressed in the form:

$$P=K[(V+.I+)+(V-.I-)]=(V1.I1+V2.I2+V3.I3) \qquad (3)$$

The values of the current signals I+, I–, I1, I2, I3 and voltages signals V+, V–, V1, V2, V3 are values represen-
tative of the currents and voltages over a period of the AC signals, or example rms or mean values. The products V+.I+, V1.I1, V2.I2 and V3.I3 of the voltage and current signals represent mean values of the power over an integration period T. Another expression of the power as a function of values v+, i+, v–, i–, v1, i1, v2, i2, v3 and i3 representative of the instantaneous values of the signals I+, V+, V–, i–, V1, I1, V2, I2, V3, I3 is given by the expression (4):

$$P = \frac{1}{T} \int_0^T [(v1.i1) + (v2.i2) + (v2.i2)] dt = \qquad (4)$$

$$\frac{K}{T} \int_0^T [(v+.i+) + (v+.i+)] dt$$

The integration period T is generally equal to the period of the AC signals supplied to the meter.

As an example, in the expressions which follow the product V1.I1 is also representative of the mean power $$\frac{1}{T} \int_0^T v1.i1 \, dt.$$

A synchronization signal 16 can be supplied to the converter 12, so that the values of the voltages and currents are in phase with other devices of the power system operating in AC mode. The meter 13 can receive commands via a line 17, notable for change of billing rate, or send information, such as the electrical energy values, via a line 18.

Figure 3:
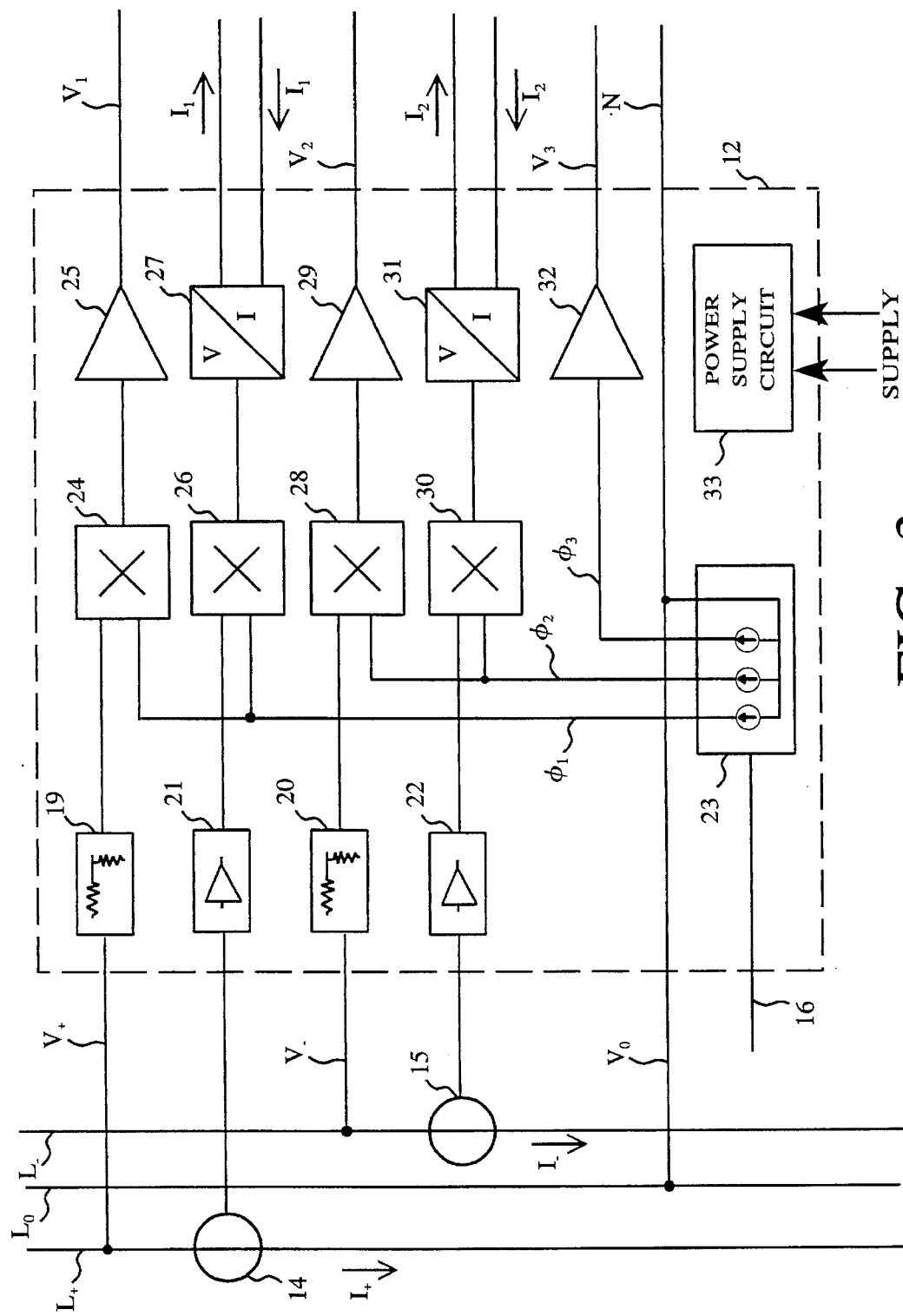
FIG. 3 represents, in block diagram form, a first embodiment of a conversion circuit of the device according to FIG. 2.

FIG. 3 represents a first embodiment of the converter 12 of FIG. 2. The converter 12 supplies three three-phase voltage signals V1, V2 and V3 and two currents I1 and I2. The current I1 is representative of the value I+ of the current flowing in the conductor L+ and the current I2 is representative of the current I– flowing in the conductor L–. The AC voltages V1 and V2 are respectively representative of the DC voltages V+ and V–. The voltage V3 is independent of the input signals. It has no effect on calculation of the energy, the current I3 associated with the same phase being forced to zero. To achieve this the corresponding input of the meter 13 simply has to be left floating (not connected).

Levelling circuits 19 and 20, constituted for example by attenuators, set the input voltage levels V+, V– to values compatible with the electronic circuitry forming the converter 12. For the same reasons, circuits 21 and 22 adapt the signals representative of the currents I+ and I– supplied by the current sensors 14, 15.

In the embodiment of FIG. 3, a generator 23 supplies 3 three-phase AC signals φ1, φ2 and φ3 with a phase difference of 120° with respect to the neutral conductor N, itself directly connected to the conductor LO in the figure. The signal φ1 is modulated by the value representative to the V+, supplied by the circuit 19, in a multiplier 24. The output AC signal of the multiplier 24 is amplified by an amplifier 25 to supply the AC voltage V1, adapted to the meter 13 and representative of V+. The signal φ2 is modulated by the valve representative of the current I+, supplied by the circuit 21, in a multiplier 26.

The output of the multiplier 26 is applied to the input of a voltage-current converter 27 to supply the AC current adapted to the meter 13 and representative of I+. As the voltage V1 and current I1 are the result of a modulation of the same AC signal φ1, they do not have any phase difference and the expression of the corresponding power is V1.I1. The levelling circuits 19 and 21, amplifier 25 and converter 27 are constituted in such a way that the output power V1.I1 is proportional, except for the known factor K, to the power supplied V+.I+. The corresponding electrical energy metered by the meter 13 is supplied by the expression:

$$W3 = K \int_0^T (V+.I+)dt = \int_0^T (V1.I1)dt \quad (5)$$

The signals V− and I− are processed in the same way as the signals V+ and I+. The signal φ2, with a phase difference of 120° with respect to φ1, is modulated in a multiplier 28 by the signal V− supplied by the circuit 20 and representative of the voltage on the conductor L−. The output signal from the multiplier 28 is amplified by an amplifier 29 which supplies the output AC voltage V2 with a phase difference of 120° with respect to V1. Modulation of the signal φ2 by the value representative of the current I− supplied by the circuit 22, is performed by a multiplier 30. The output of the multiplier 30 is connected to the input of a voltage-current converter 31 which supplies the AC current I2 in phase with V2. The circuits 20 and 22, amplifier 29 and converter 31 are constituted in such a way that the output power V2.I2 is representative of the power (V−).(I−) to which it is proportional, except for the factor K. The corresponding electrical energy metered by the meter 13 is supplied by the expression:

$$W4 = K \int_0^T (V-.I-)dt = \int_0^T (V2.I2)dt \quad (6)$$

In order not to disturb operation of the meter 13, although the value V3 does not play any role since the current I3 is zero, it is preferable to supply to the meter 13 a signal V3 with a phase difference of 240° with respect to V1 and whose amplitude is compatible with the input of the meter. In the figure the signal V3 is supplied by an amplifier 32 receiving on input the signal φ3 from the generator 23.

The power supplied by the converter 12 is given by:

$$P1 = V1.I1 + V2.I2 \quad (7)$$

The energy received by the meter is:

$$W5 = K \int_0^T [(V+.I+) + (V-.I-)]dt = \quad (8)$$

$$\int_0^T [(V1.I1) + (V2.I2)]dt$$

The known factor K is taken into account when manufacturing, setting the parameters or calibrating the meter. The correspondence between the known factor K and calibration of the meter enables metering and display of the real value of the energy consumed with is expressed by:

$$W6 = \int_0^T [(V+.I+) + (V-.I-)]dt = \quad (9)$$

$$\frac{1}{K} \int_0^T [(V1.I1) + (V2.I2)]dt$$

As electrical power supply circuit 33 supplies the necessary operating voltages to the electronic circuitry constituting the converter 12. The electrical power supply circuit 33 can, for example, be supplied with AC or DC.

Figure 4A:
FIGS. 4a to 4e illustrate respectively the variations of the input signals 4a, 4b, output signals 4c, and 4d and the energy measured by a metering device comprising a conversion circuit according to FIG. 3.
Figure 4B:
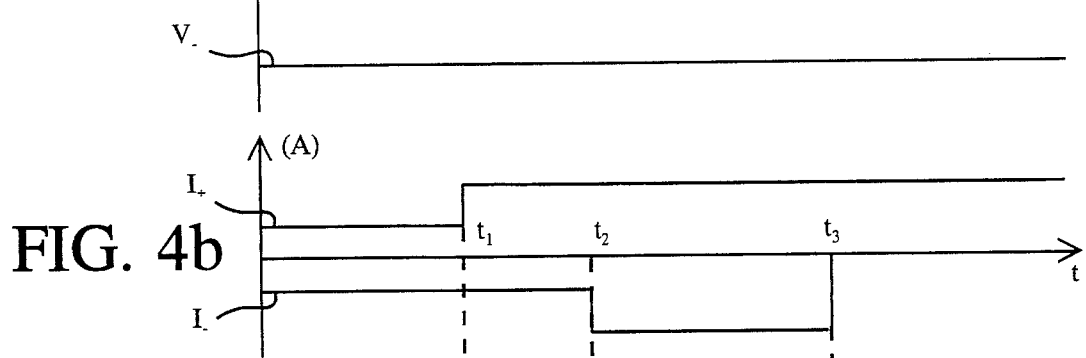
Figure 4C:
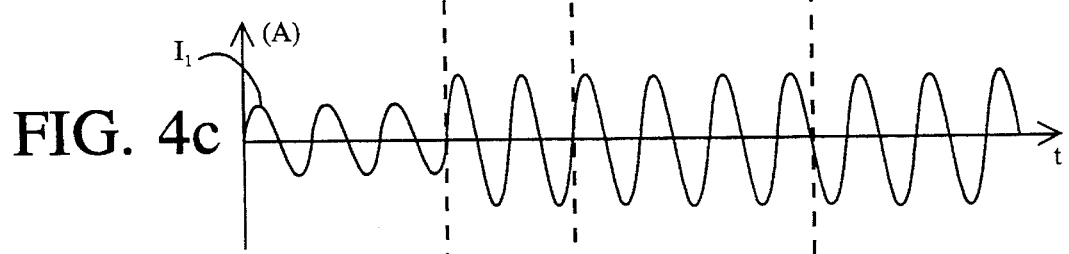
Figure 4D:
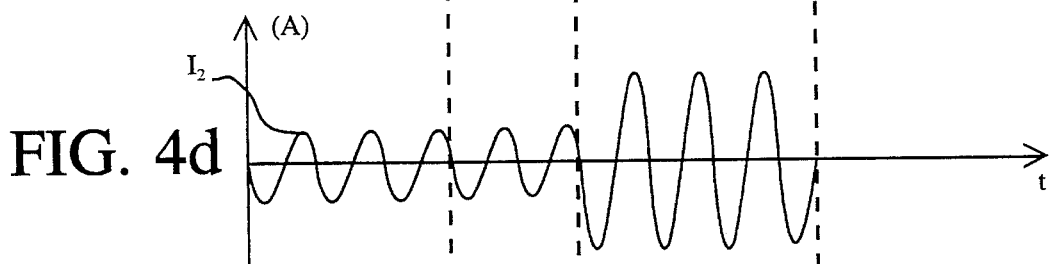
Figure 4E:
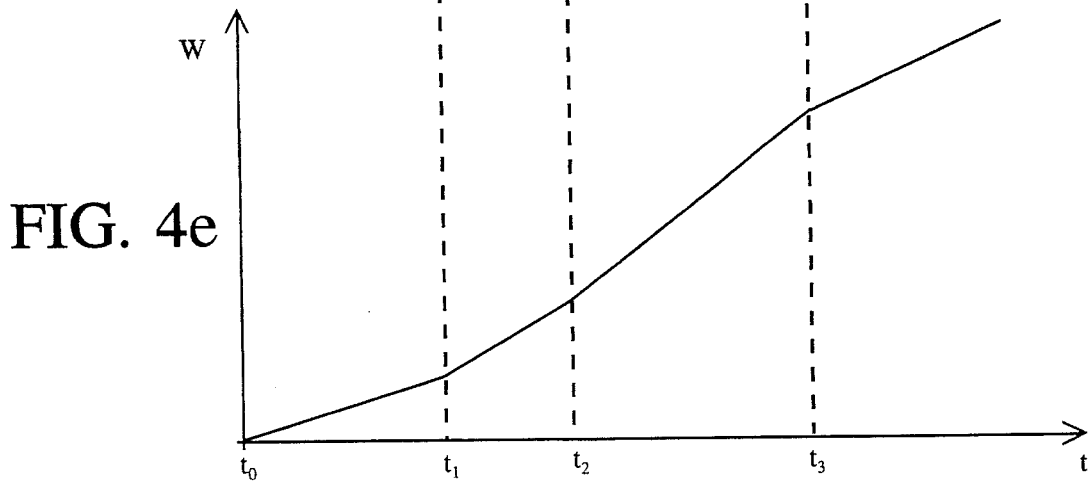

FIGS. 4a to 4e illustrate an example of variations of the voltage, current and energy values in a converter according to FIG. 3. On the curves of the FIG. 4a, the DC voltages V+ and V− are stable and constant. The curves of FIG. 4b show the variations of I+ and I−. The current I+ takes a first value up to a time T1. It then takes a second, higher, value. The current I− takes a first value up to a time t2, then it changes value up to a time t3 when it becomes zero. The curve of FIG. 4c illustrates the shape and variations of I1. The amplitude of the AC current I1 follows the variations of I+. Its value changes at the time t1. Likewise, the curve of FIG. 4d illustrates the shape and variations of I2. The amplitude of I2 increases at the time t2 and becomes zero at t3. The curve 4e shows the variations of the energy metered by the meter. Between the times t0 and t1 the energy increases as a function of the first values of I+ and I−. Then between the times t1 and t2 it increases more quickly as a function of the first value I− and of the second value I+. The increase is even quicker between t2 and t3 where it depends on the second values of I− and I+, which are high. From the time t3 the increase is smaller, the value I− being reduced to zero.

Figure 5:
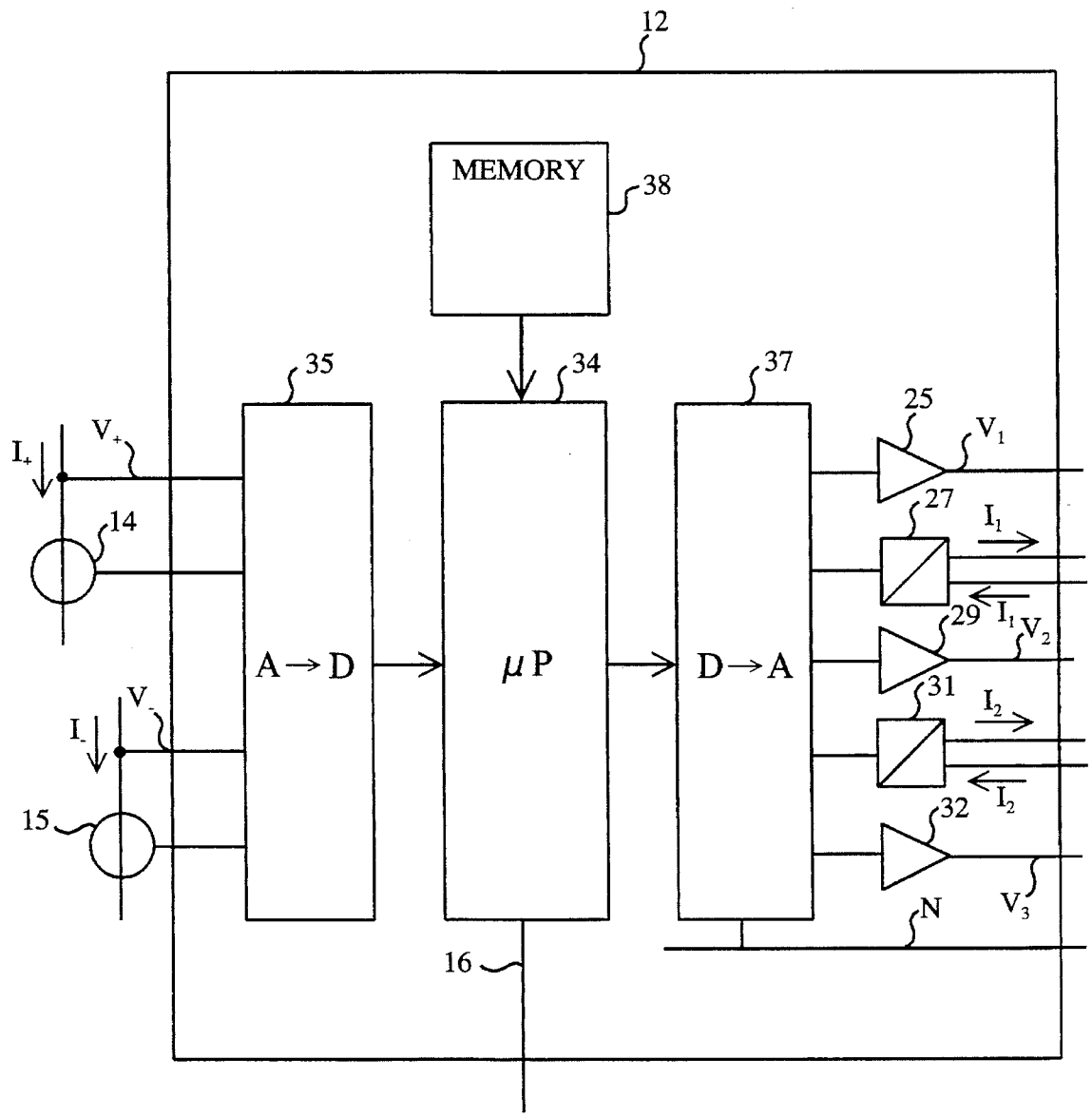
FIG. 5 represents, in block diagram form, another embodiment of a conversion circuit according to FIG. 2.

Another embodiment of a converter 12 is represented in FIG. 5. The multipliers 24, 26, 28, 30 and generator 23 of FIG. 3 are replaced by a microprocessor 34 associated with an analog-to-digital convert 35, and analog-to-digital converter 37 and a memory 38. The values representative of the voltages V+ and V− and of the currents I+ and I− are applied to the input of the converter 35 which supplies digital input values to the microprocessor. The micro-processor supplies the converter 37 with the digital output values representative of the analog AC values of the voltages V1, V2 and V3 and currents I1 and I2 such that V1 and I1 are AC signals, in phase, representative respectively of V+ and I+, V2 and I2 having a phase difference of 120° with respect to V1 and being respectively representative of V− and I−. V3 is an Ac signal with a phase difference of 240° with respect to V1 and of preset fixed amplitude. As in FIG. 3, the values representative of the voltages are amplified by the amplifiers respectively 25, 29 and 32 and the values representative of the currents are converted by the voltage-current converters 27 and 31.

The AC signals are generated by the microprocessor by calculation or by reading of pre-recorded shapes in a table stored in the memory 38. These signals are modulated by calculation, preferably directly by the digital input values. The microprocessor can, in an alternative embodiment, calculate a value of the powers V+.I+ and V−. I− in terms of the digital input values which are applied thereto. The microprocessor then supplies the converter 37 with digital output values such that, after conversion by the converter 37, the analog AC signals V1, V2, V3, I1 and I2 are such that V1.I1=K.V+.I+ and V2.I2=K.V−.I−, V1 and I1 being in phase, V2 and I2 having a phase difference of 120° with respect to V1 and V3 a phase difference of 240° with respect to V1. In this embodiment, V1 is not representative of V+ and I1 of I−, but the product V1 and I1 is representative of the product V+.I+ and the product V2 I2 is representative of the product V−.I−.

Figure 6:
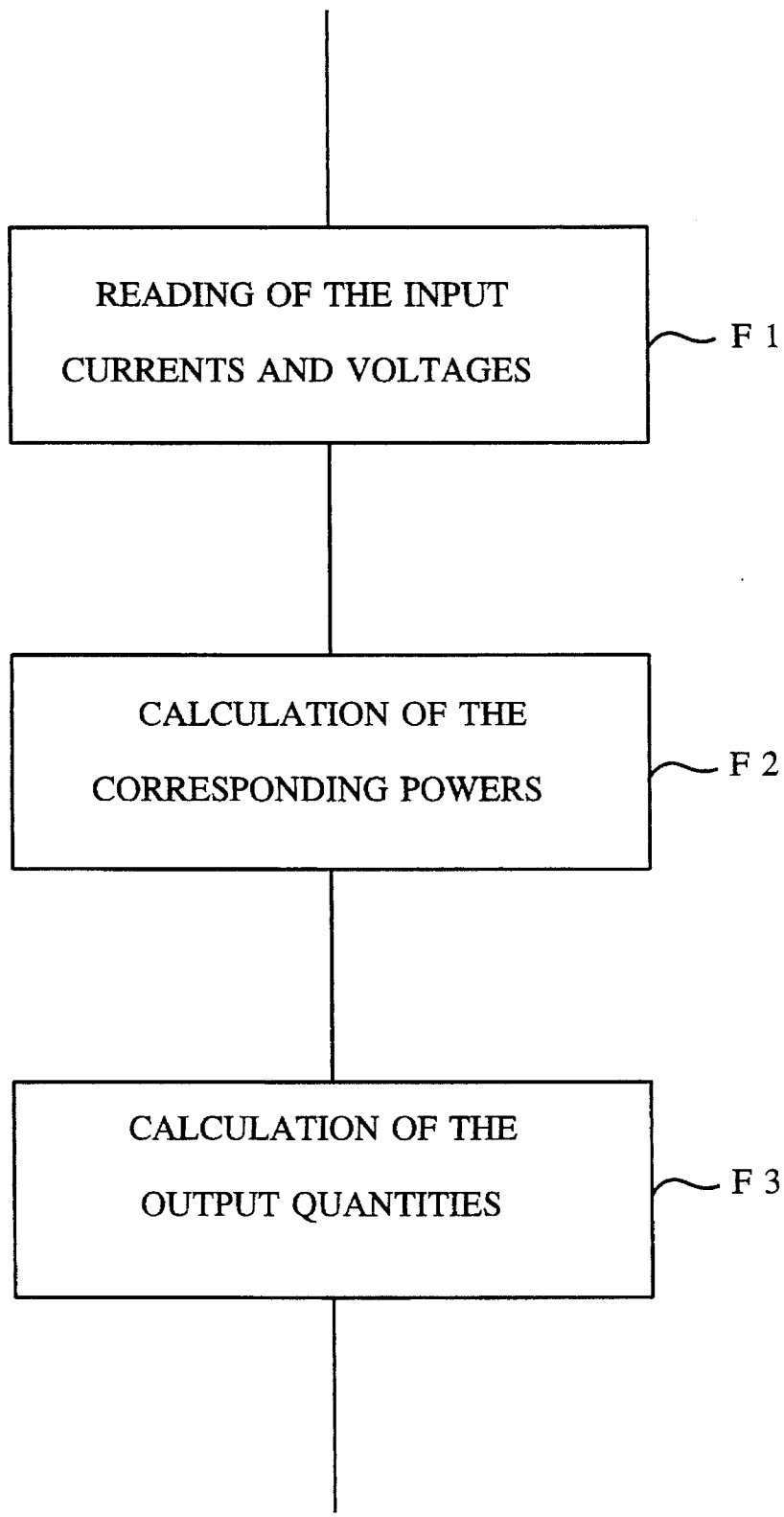
FIG. 6 represents a partial flowchart of the microprocessor program in an alternative embodiment of the circuit according to FIG. 5.

According to a second alternative embodiment, the microprocessor supplies output AC voltages V1, V2 and V3 of preset amplitude independent of the input signals and the amplitudes of the AC currents I1 and I2 are respectively representative of the powers V+.I+ and V−.I−. FIG. 6 illustrates a partial flowchart enabling one of the output quantities to be calculated, for example I1. After reading of the input voltages and current, for example V+ and I+ (phase F1), the microprocessor calculates the corresponding powers (phase F2, for example V+.I+. It can then calculate the output quantities (phase F3), for example I1=K.V+.I+/V1. Calculation of I2 is performed in a similar way from the formula I2=K.V−.I−/V2.

In all cases, the energy calculated by the meter is proportional to the energy consumed to be measured.

In the embodiments described above the standard meter is a three-phase meter. It is possible to use a single-phase meter receiving only V1 and I1. In this case the AC signals I1 and V1, in phase, must be such that the power V1.I1 is proportional to the power supplied to the installation, i.e.:

$$V1.I1 = K[(V+.I+)+(V-.I-)] \quad (10)$$

In this case, the converter 12 must comprise means for calculating the partial powers V+.I+ and V−.I−, of calculating the sum of these partial powers and of supplying signals I1 and V1 whose product is proportional to this sum. This can be achieved without difficulty with a microprocessor-based converter, where in the embodiments described above, one of the values V1 or I1 is kept constant, the other, respectively I1 or V1, then being proportional to the power calculated.

The devices described above comprise two power measuring inputs, a first one (V+, I+) corresponding to the conductor L+ and a second one (V−, I−) corresponding to the conductor L−. The number of inputs may be different, one for example for DC power supplies with two conductors, three or more in other cases.

The invention is not limited to measuring the electrical energy consumed by an installation supplied with direct current. It can be used in the same way for installations supplied by deformed or disturbed currents, or for example, when the frequency of the current or voltage is not compatible with standard electrical meters. The AC signals φ1 to φ3 are preferably generated by a circuit internal to the metering device, but for economic and accounting reasons, they could be supplied by external circuits. The metering device can be achieved in different technologies for example analog, digital or mixed. Modulation processing and power calculation can be performed by operational circuits or by program if the device comprises a microprocessor.

The current sensors can comprises a measuring resistance associated with an amplifier galvanically isolated between the input and output. They can also comprise Hall effect cells or magnoresistance cells when the currents to be measured are of very high value.

We claim:

1. A device for measuring and metering the electrical energy consumed by an installation, said device comprising:
    current measurement means for measuring currents consumed by the installation through a power distribution system,
    voltage measurement means for measuring voltages applied to the installation through the power distribution system,
    a standard electrical energy meter operating in a predetermined AC current and voltage operating range and comprising current and voltage inputs,
    conversion means including a first input connected to an output of the current measurement means, a second input connected to an output of the voltage measurement means, current outputs connected to the current inputs of the standard meter, and voltage outputs connected to the voltage inputs of the standard meter,
    wherein the conversion means includes circuit means for producing output AC current and voltage signals suitable for the standard meter in response to current and voltage signals supplied from the current measurement means and the voltage measurement means, wherein an electrical power corresponding to the AC current and voltage signals supplied by the conversion means is proportional to an electrical power of the current and voltage signals respectively supplied by the current measurement means and the voltage measurement means, and wherein at least one of the current and voltage signals supplied by the current measurement means and the voltage measurement means is incompatible with the current and voltage operating range of the standard meter.

2. The device according to claim 1, wherein the conversion means receives a first set of voltage and current signals from the current measurement means and the voltage measurement means and supplies the standard meter with a second set of AC voltage and current signals, such that the power corresponding to a sum of the voltage-current products of the second set of voltage and current signals is proportional to the power corresponding to a sum of the voltage-current products of the first set of voltage and current signals.

3. The device according to claim 1, wherein the conversion means includes means for monitoring and modulating the amplitude of the output AC current and voltage signals in terms of values of current and voltage signals received by the conversion means from the current measurement means and the voltage measurement means.

4. The device according to claim 1, wherein the conversion means includes means for monitoring and modulating the amplitude of the output AC current and voltage signals in terms of power associated with at least one current signal and one associated voltage signal respectively supplied to the conversion means by the current measurement means and the voltage measurement means.

5. The device according to claim 1, wherein the conversion means includes means for amplifying at least one voltage signal received from the voltage measurement means and supplying an AC output voltage signal of an amplitude compatible with the operating voltage range of the standard meter, and means for voltage-current converting at least one current signal received from the current measurement means into an output current that is compatible with the operating current range of the standard meter.

6. The device according to claim 1, wherein the conversion means includes means for producing AC output signals of a frequency compatible with an operating frequency of the standard meter.

7. The device according to claim 6, wherein said means for producing AC output signals produces three-phase output signals, and wherein the standard meter is a three-phase meter.

8. The device according to claim 1, wherein the installation is supplied with DC.

9. The device according to claim 8, wherein the conversion means receives first and second sets of input voltage and current signals from the current measurement means and the voltage measurement means, the standard meter is a three-phase meter, the conversion means supplies a first set of output AC voltage and current signals, whose power is representative of the power of the first set of input current and voltage signals received from the current measurement means and the voltage measurement means, and a second set of AC output voltage and current signals having a phase difference of 120° with respect to the first set of output AC voltage and current signals and whose power is representative of the power of the second set of input current and voltage signals, and the standard meter includes a current input forced to zero.

10. The device according to claim 1, wherein the installation is supplied with AC of a frequency different from an operating frequency of the standard meter.

* * * * *